United States Patent
Kobayashi

(10) Patent No.: US 11,740,643 B2
(45) Date of Patent: Aug. 29, 2023

(54) TEMPERATURE CONTROL DEVICE AND METHOD, AND INSPECTION APPARATUS

(71) Applicant: TOKYO ELECTRON LIMITED, Tokyo (JP)

(72) Inventor: Masahito Kobayashi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 269 days.

(21) Appl. No.: 17/172,655

(22) Filed: Feb. 10, 2021

(65) Prior Publication Data

US 2021/0247786 A1 Aug. 12, 2021

(30) Foreign Application Priority Data

Feb. 12, 2020 (JP) ................................. 2020-021128

(51) Int. Cl.
  *G05D 23/27* (2006.01)
  *G05D 23/19* (2006.01)
  *H01L 21/67* (2006.01)

(52) U.S. Cl.
  CPC ......... *G05D 23/27* (2013.01); *G05D 23/1919* (2013.01); *H01L 21/67248* (2013.01)

(58) Field of Classification Search
  CPC ............... G05D 23/27; G05D 23/1919; H01L 21/67248
  See application file for complete search history.

(56) References Cited

U.S. PATENT DOCUMENTS

| 6,032,724 A * | 3/2000 | Hatta ................. H01L 21/67103 |
| | | 118/724 |
| 2020/0013645 A1* | 1/2020 | Gouda ............... G01R 31/2879 |

FOREIGN PATENT DOCUMENTS

| JP | H10-135315 A | 5/1998 |
| JP | 2002-318602 A | 10/2002 |
| JP | 2002318602 A * | 10/2002 |
| JP | 4894582 B2 * | 3/2012 |
| KR | 10-2019-0069539 A | 6/2019 |
| WO | WO 2018/100881 A1 | 6/2018 |

OTHER PUBLICATIONS

JP-2002318602-A Translation (Year: 2002).*
JP-4894582-B2 Translation (Year: 2012).*

* cited by examiner

*Primary Examiner* — Schyler S Sanks
(74) *Attorney, Agent, or Firm* — Fenwick & West LLP

(57) ABSTRACT

A temperature control device for controlling a temperature of a temperature control object is provided. The temperature control device includes a heating mechanism having a heating source configured to heat the temperature control object, a cooling mechanism having a cooling source configured to cool the temperature control object, an infrared sensor configured to measure the temperature of the temperature control object, and a temperature controller configured to allow a control system including a sliding mode control to control the heating mechanism and the cooling mechanism based on a measurement signal from the infrared sensor and perform a feedback control of the temperature of the temperature control object.

16 Claims, 12 Drawing Sheets

$dx/dt = A*x + B*u1$

TEMPERATURE CONTROL DEVICE AND METHOD, AND INSPECTION APPARATUS

CROSS-REFERENCE TO RELATED APPLICATIONS

This application claims priority to Japanese Patent Application No. 2020-021128, filed on Feb. 12, 2020, the entire contents of which are incorporated herein by reference.

TECHNICAL FIELD

The present disclosure relates to a temperature control device and method, and an inspection apparatus.

BACKGROUND

In a semiconductor manufacturing process, a multiple number of electronic devices having a predetermined circuit pattern are formed on a semiconductor wafer (hereinafter, simply referred to as "wafer"). Inspection of electrical characteristics is performed on these electronic devices, and the electronic devices are classified into defective products or non-defective products.

Japanese Patent Application Publication No. H10-135315 discloses an inspection apparatus for performing inspection of electrical characteristics on electronic devices on a wafer before the electronic devices are individually cut out from the wafer. The inspection apparatus includes a probe card having a multiple number of pin-shaped probes, a substrate support for placing thereon a wafer, and a tester. In the inspection apparatus, each probe of the probe card comes into contact with an electrode pad or a solder bump installed correspondingly to an electrode of the electronic device formed on the wafer. Then, an electric signal is transmitted from the electronic device to the tester to inspect the electrical characteristics of the electronic device. Further, the inspection apparatus disclosed in Japanese Patent Application Publication No. H10-135315 includes a temperature controller for controlling the temperature of the substrate support using a cooling channel or a heater in order to emulate an implementation environment of the electronic device during the inspection of the electrical characteristics of the electronic device.

Further, Japanese Patent Application Publication No. 2002-318602 discloses a method for controlling a temperature of a wafer by performing a sliding mode control using cooling water and a thermoelectric conversion module.

SUMMARY

In view of the above, the present disclosure provides a temperature control device and method and an inspection apparatus capable of performing a feedback control of a temperature of a temperature control object with high accuracy and at a high speed.

In accordance with an aspect of the present disclosure, there is provided a temperature control device for controlling a temperature of a temperature control object, the temperature control device including: a heating mechanism having a heating source configured to heat the temperature control object; a cooling mechanism having a cooling source configured to cool the temperature control object; an infrared sensor configured to measure the temperature of the temperature control object; and a temperature controller configured to allow a control system including a sliding mode control to control the heating mechanism and the cooling mechanism based on a measurement signal from the infrared sensor and perform a feedback control of the temperature of the temperature control object.

BRIEF DESCRIPTION OF THE DRAWINGS

The objects and features of the present disclosure will become apparent from the following description of embodiments, given in conjunction with the accompanying drawings, in which.

DETAILED DESCRIPTION

Hereinafter, embodiments of the present disclosure will be described in detail with reference to the accompanying drawings.

<Inspection Apparatus>

First, an inspection apparatus according to an embodiment will be described.

Figure 1:
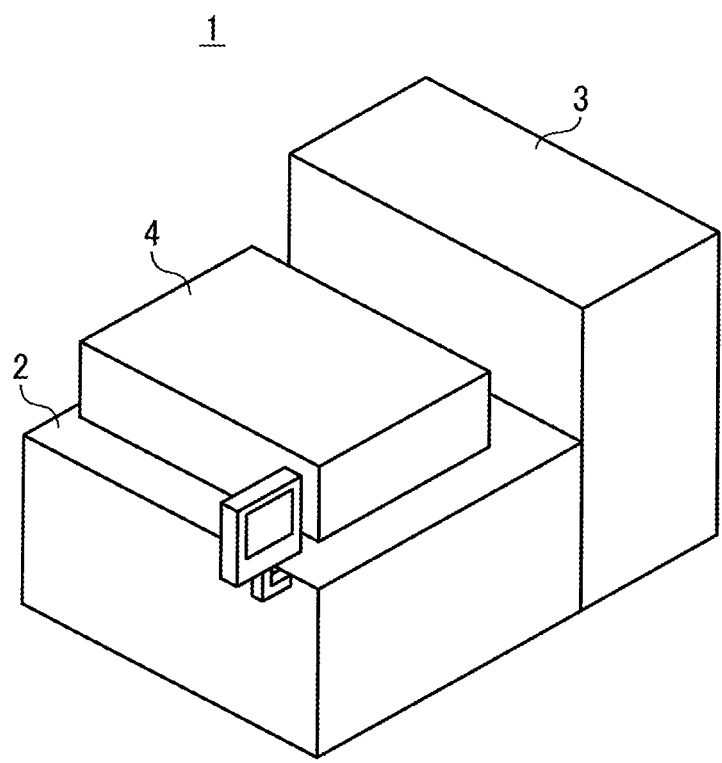
FIG. 1 is a perspective view showing a schematic configuration of an inspection apparatus according to an embodiment.
Figure 2:
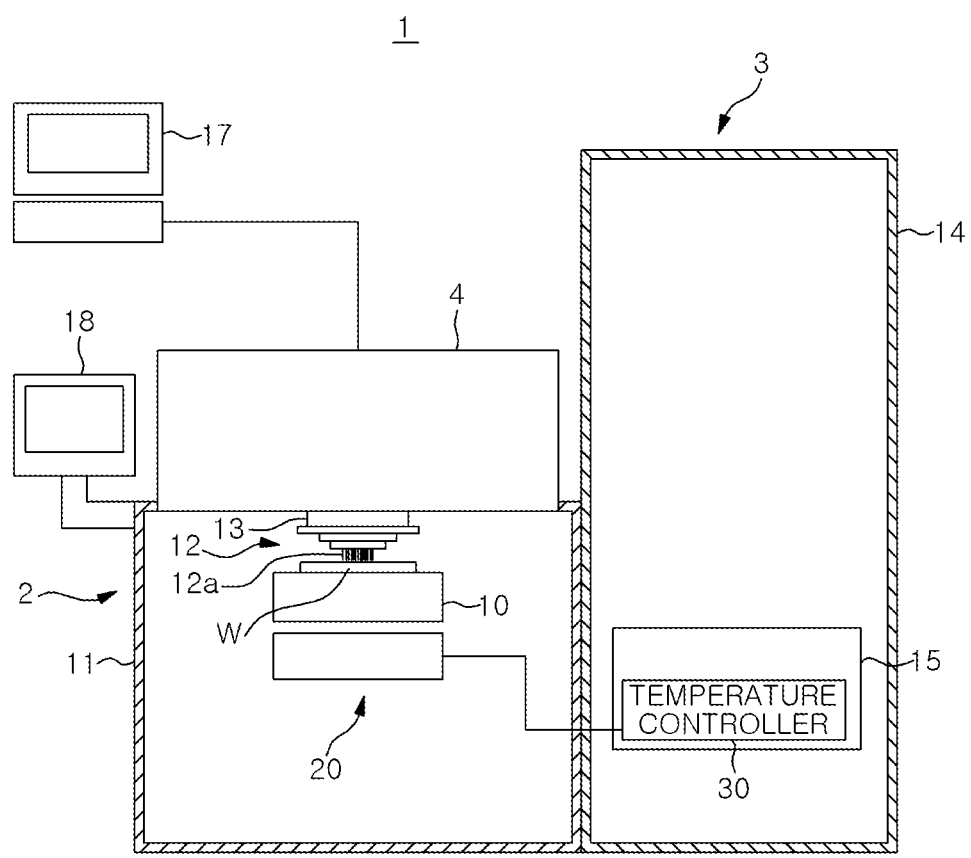
FIG. 2 is a vertical cross-sectional view showing a part of the inspection apparatus of FIG. 1.

FIG. 1 is a perspective view showing a schematic configuration of an inspection apparatus according to an embodiment. FIG. 2 is a vertical cross sectional view showing a part of the inspection apparatus of FIG. 1.

As shown in FIGS. 1 and 2, an inspection apparatus 1 is configured to inspect electrical characteristics of each electronic device formed on a wafer W serving as a substrate. The inspection apparatus 1 includes an inspection unit 2, a loader 3, and a tester 4.

The inspection unit 2 includes a hollow housing 11. The housing 11 includes therein a stage 10 on which an inspection target wafer W is attracted and held. Further, the stage 10 is configured to be movable in a horizontal direction and a vertical direction by a moving mechanism (not shown). The inspection unit 2 further includes a temperature control device 20 that is disposed below the stage 10 for controlling a temperature of the stage. The temperature control device 20 will be described in detail later.

A probe card 12 is disposed above the stage 10 in the inspection unit 2 to be opposed to the stage 10. The probe card 12 has a multiple number of probes 12a that are contact members. Further, the probe card 12 is connected to the tester 4 through an interface 13. When each probe 12a comes into contact with an electrode of each electronic device of the wafer W, the probe 12a supplies the electric power from the tester 4 to the electronic device through the interface 13 or transmits a signal from the electronic device to the tester 4 through the interface 13. Therefore, the interface 13 and the probes 12a function as a supply member for supplying the electric power to the electronic devices.

The loader 3 includes a housing 14. In the housing 14, a FOUP (not shown) that is a transfer container in which the wafer W is accommodated is disposed. Further, the loader 3 has a transfer device (not shown). The transfer device extracts the wafer W accommodated in the FOUP and transfers the wafer W onto the stage 10 of the inspection unit 2. Further, the transfer device transfers the inspected wafer W of which electrical characteristics are inspected from the stage 10 and accommodates the inspected wafer W in the FOUP.

In the housing 14 of the loader 4, a control unit 15 is disposed to perform various controls such as the temperature control of the inspection target electronic devices.

The control unit 15 may be a computer, and includes a temperature controller 30 included in the temperature control device 20. The control unit 15 further includes, in addition to the temperature controller 30, a main controller having a plurality of functional units for controlling the individual components of the inspection apparatus 1. The main controller is configured to control the individual components of the inspection apparatus 1. Further, the control unit 15 further includes an input device, an output device, a display device, and a storage device. The main controller controls the individual components based on a processing recipe that is a control program stored in a storage medium (a hard disk, an optical desk, a semiconductor memory, or the like) built in the storage device.

Alternatively, the control unit 15 may be disposed in the housing 11 of the inspection unit 2.

At the housing 11 of the inspection unit 2, a user interface unit 18 constituting a part of the control unit 15 is disposed. The user interface unit 18 is configured to display various pieces of information for a user or allows the user to input instructions. The user interface 18 includes an input unit such as a touch panel or a keyboard and a display unit such as a liquid crystal display.

The tester 4 includes a test board (not shown) that emulates a part of a circuit configuration of a motherboard on which the electronic devices are mounted. The test board is connected to a tester computer 17 that is configured to determine whether the electronic devices are defective or non-defective based on the signals from the electronic devices. In the tester 4, it is possible to emulate the circuit configurations of various types of motherboards by replacing the test board.

The probe card 12, the interface 13, and the tester 4 constitute an inspection mechanism.

When the inspection of the electrical characteristics of the electronic device is performed, the tester computer 17 transmits data to the test board connected to the electronic device through each probe 12a. Then, the tester computer 17 determines whether the transmitted data has been correctly processed by the test board based on the electric signal from the test board.

Figure 3:
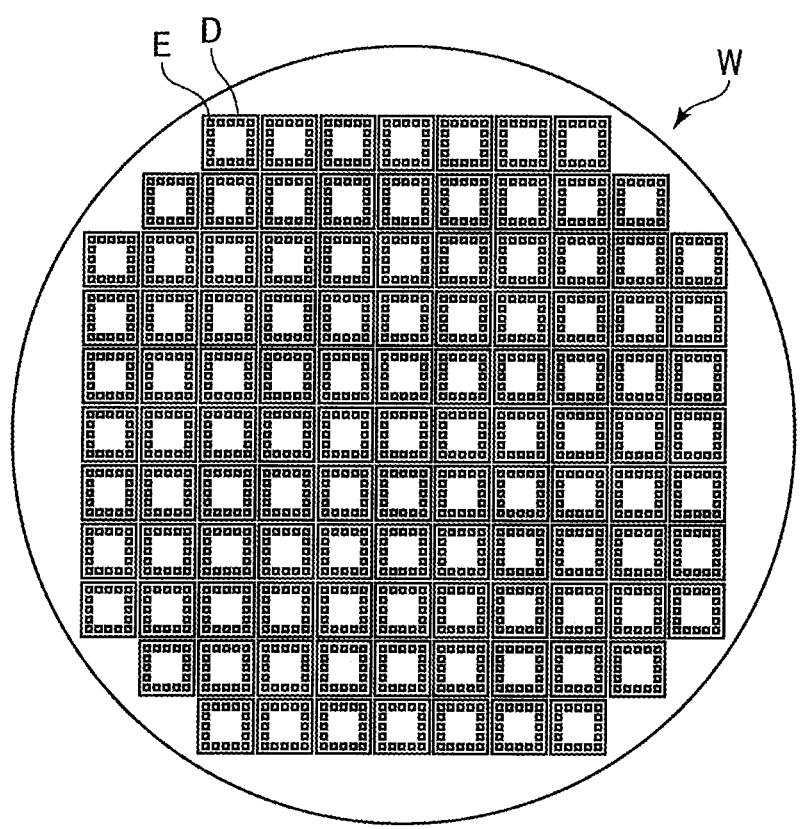
FIG. 3 is a plan view schematically showing a configuration of a wafer that is an inspection target substrate.

As shown in FIG. 3, the wafer W that is an inspection target substrate is formed of a substantially disc-shaped silicon substrate, and a multiple number of electronic devices D are formed at predetermined intervals on a surface of the silicon substrate through etching and wiring processes. Electrodes E are formed on a surface of each electronic device D, and the electrodes E are electrically connected to a circuit element in the electronic device D. A current is supplied to the circuit element in the electronic device D by applying a voltage to the electrodes E.

<Temperature Control Device>

Figure 4:
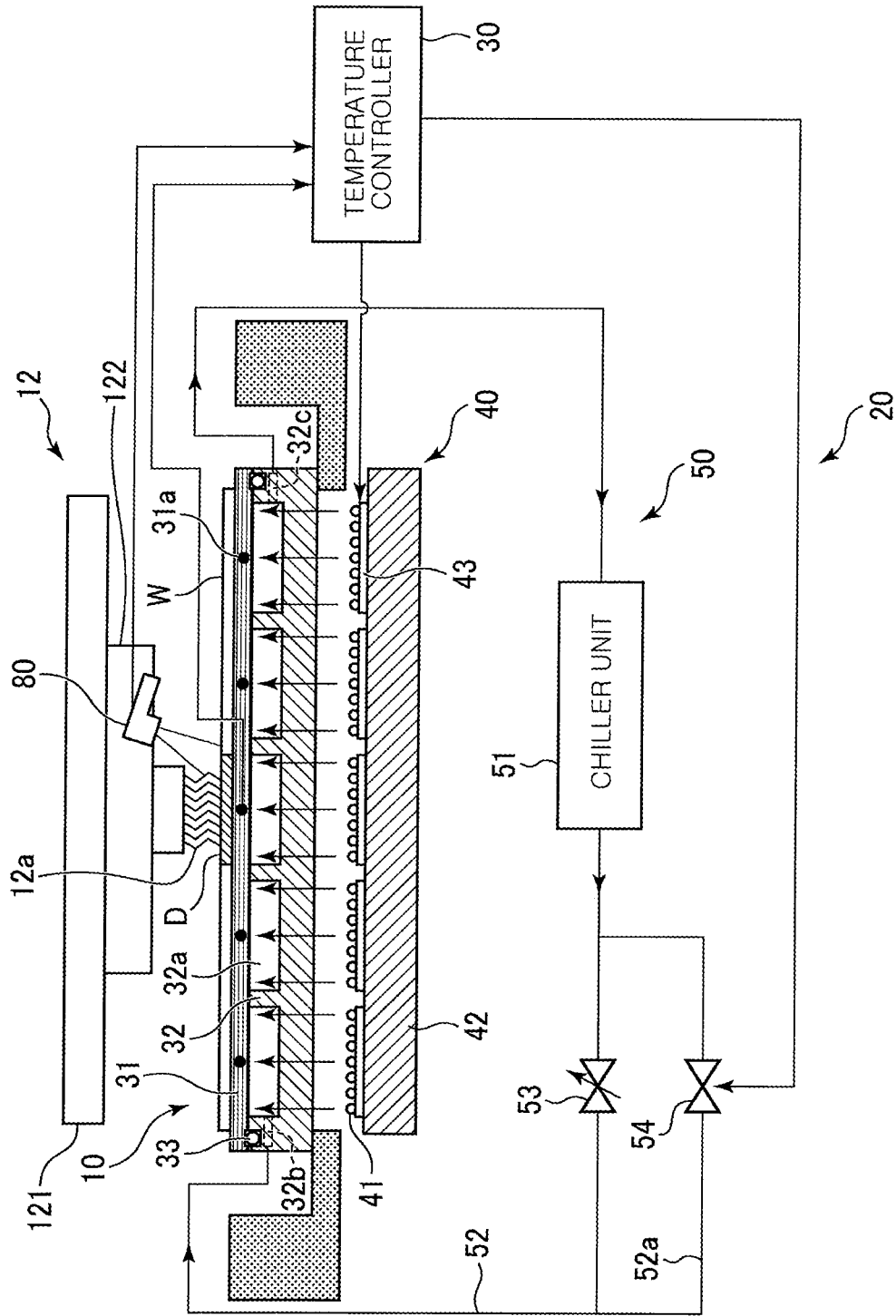
FIG. 4 is a cross-sectional view schematically showing a configuration of an upper portion of a stage, a probe card provided with an infrared sensor, and a temperature control device, and illustrates a state during inspection.

Next, a configuration of the temperature control device 20 will be described with reference to FIG. 4. FIG. 4 is a cross-sectional view schematically showing a configuration of an upper portion of the stage 10, a configuration of the probe card 12 provided with an infrared sensor, and the temperature control device 20. In FIG. 4, a state in which the inspection is performed is illustrated.

As shown in FIG. 4, the stage 10 includes a base member 32 and a lid member 31. The lid member 31 is installed on the base member 32 through a seal ring 33. The wafer W is attracted and held on the lid member 31.

The lid member 31 has a disc shape and is made of, for example, SiC. SiC has high thermal conductivity and a high Young's modulus. Further, the lid member 31 has high absorption efficiency for light from an LED 41 of a heating mechanism 40 to be described later, and thus can be efficiently heated by the light from the heating mechanism 40.

An attraction hole (not shown) for attracting the wafer W is formed on an upper surface of the lid member 31. Further, a multiple number of temperature sensors 31a are installed in the lid member 31 while being spaced apart from each other in plan view. A thermocouple is generally used as the temperature sensors.

The base member 32 has a disc shape having substantially the same diameter as that of the lid member 31, and is made of a material that is transparent to light of a specific wavelength from the LED to be described later. An upper portion of the base member 32 has a groove through which a coolant flows. The groove is covered by the lid member 31 to form a coolant channel 32a. In other words, the stage 10 has the coolant channel 32a therein.

The probe card 12 includes a base substrate 121 and a multilayer ceramic substrate 122. A multiple number of probes 12a project from the multilayer ceramic substrate 122. An infrared sensor 80 for measuring the temperature of the electronic device D at the time of inspection is mounted on the multilayer ceramic substrate 122. The infrared sensor is a non-contact temperature sensor for detecting a temperature of a measurement target object from the amount of infrared rays emitted depending on the temperature of the measurement target object. As an example of the infrared sensor 80, various elements that are conventionally available can be used. For example, a thermal diode may be used. The infrared sensor may be in the form of an infrared camera or a radiation thermometer. The infrared sensor has a very high response speed of 10 msec or less.

FIG. 4 shows an example in which the infrared sensor 80 is attached to an outer peripheral portion of the multilayer ceramic substrate 122 of the probe card 12 to measure the temperature of the peripheral portion of the electronic device D from the outer side of the probes 12a.

Figure 5:
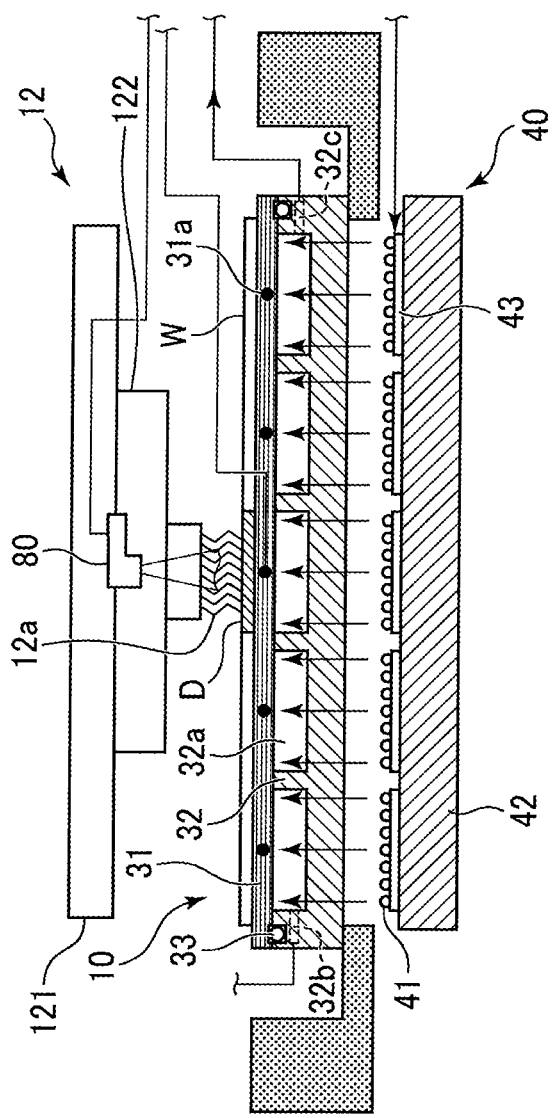
FIG. 5 is a cross-sectional view showing another mounting example of the infrared sensor.

As shown in FIG. 5, an infrared ray transmissive material may be used as the multilayer ceramic substrate 122, and the infrared sensor 80 may be disposed at the center of the upper portion of the multilayer ceramic substrate 122 (position above the probes 12a) to measure the temperature of the central portion of the electronic device D from the position above the probes 12a.

The temperature control device 20 includes a heating mechanism 40, a cooling mechanism 50, and a temperature controller 30. The temperature control device 20 controls the temperature of an electronic device D formed on the wafer W on the stage 10, to be maintained at a target temperature by controlling the heating using the heating mechanism 40, the cooling using the cooling mechanism 50, and the heating/cooling using the temperature controller 30.

The heating mechanism 40 is configured as a light irradiation mechanism that irradiates light to the lid member 31 of the stage 10 to heat the lid member 31, so that the wafer W is heated and the electronic device D formed on the wafer W is heated.

Figure 6:
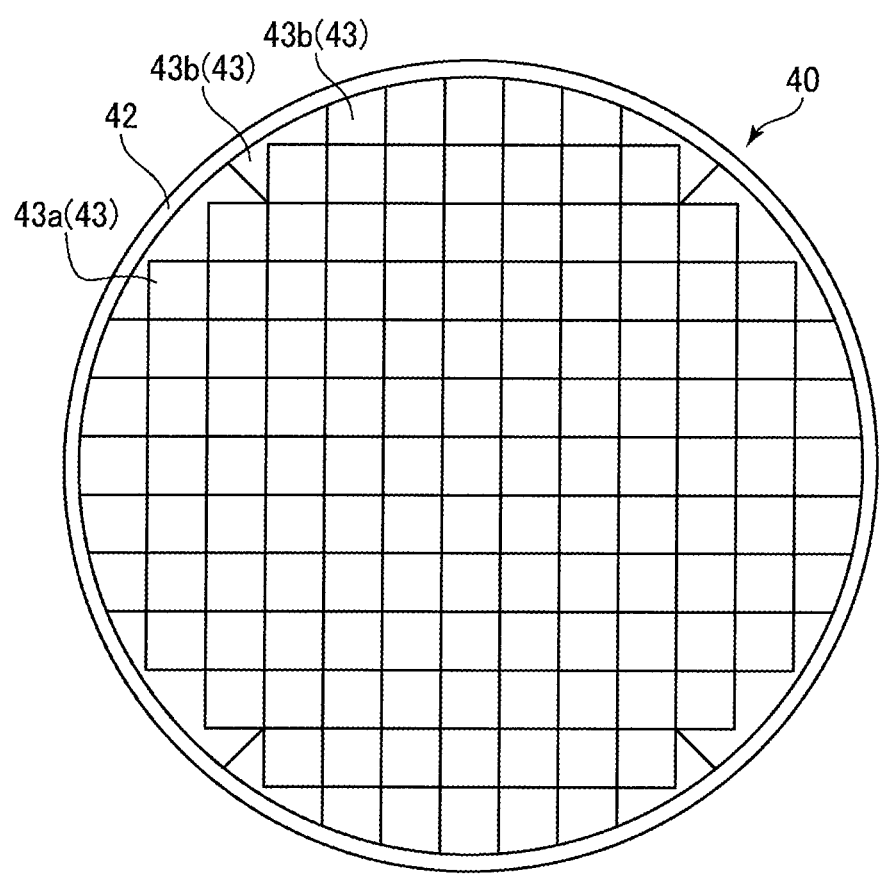
FIG. 6 is a cross-sectional view schematically showing a configuration of a heating mechanism.

The heating mechanism 40 is disposed to face a surface of the stage 10 that is opposite to a surface of the stage 10 on which the wafer W is placed, i.e., a bottom surface of the base member 32. The heating mechanism 40 has a plurality of LEDs 41 for emitting light toward the wafer W as a heating source. Specifically, the heating mechanism 40 has a configuration in which a multiple number of LED units 43, each including a plurality of LEDs 41, are mounted on a surface of a base 42. As shown in FIG. 6, for example, the LED units 43 in the heating mechanism 40 include units 43a, each of which has a square shape in plan view, and units 43b, each of which has a non-square shape in plan view. The square-shaped units 43a are disposed correspondingly to the electronic devices D (see FIG. 3), and the non-square units 43b are disposed at an outer peripheral portion of the LED units 43. The units 43a and 43b cover substantially the entire surface of the base 42, and the light can be emitted from the LEDs 41 of the respective LED units 43 to at least the entire portion of the lid member 31 where the wafer W is placed.

Each of the LEDs 41 emits, for example, near-infrared light. The light emitted from the LEDs 41 (hereinafter, also referred to as "LED light") passes through the base member 32, which is a light transmitting member, of the stage 10. The coolant flowing through the coolant channel 32a is made of a material that can transmit the light from the LEDs 41. The light that has transmitted through the base member 32 passes through the coolant flowing through the coolant channel 32a and is incident on the lid member 31. When the light from the LEDs 41 is near-infrared light, the light transmitting member forming the base member 32 may be made of polycarbonate, quartz, polyvinyl chloride, acrylic resin, or glass. These materials are easily processed and molded.

In the heating mechanism 40, the irradiation and non-irradiation of the LED light input to the lid member 31 of the stage 10, on which the wafer W is placed, is controlled for each of the LED units 43. Therefore, the heating mechanism 40 can irradiate the LED light to an arbitrary (desired) number of sites on the lid member 31, or can allow the intensity of the light irradiated to the arbitrary location to be different from those of the light irradiated to the other locations.

The cooling mechanism 50 includes a chiller unit 51, a coolant line 52, a variable flow rate valve 53, and a high-speed valve 54. The chiller unit 51 stores the coolant and controls the temperature of the coolant to a predetermined temperature. As an example of a coolant, water, which is a liquid capable of transmitting the light emitted from the LEDs 41, is used. The coolant line 52 is connected to a supply port 32b and a discharge port 32c disposed at a side portion of the base member 32, and is also connected to the chiller unit 51. The coolant in the chiller unit 51 is supplied to the coolant channel 32a through the coolant line 52 by a pump (not shown) disposed in the coolant line 52 and circulated therethrough. The variable flow rate valve 53 is disposed on a downstream side of the chiller unit 51 in the coolant line 52, and the high-speed valve 54 is disposed in a bypass line 52a for bypassing the variable flow rate valve 53 on the downstream side of the chiller unit 51. The variable flow rate valve 53 can set a flow rate and is configured to supply the coolant at the set flow rate. Further, the high-speed valve 54 is opened and closed (on/off) at a high speed so as to start and stop the supply of the coolant flowing through the bypass line 52a at a high speed.

<Temperature Controller>

Next, the temperature controller 30 will be described in detail.

During the inspection of the electronic device D, the temperature controller 30 receives the temperature measurement signal of the electronic device D measured by the infrared sensor 80; allows a control system including a sliding mode control to control the heating mechanism 40 and the cooling mechanism 50 based on the measurement signal; and performs a feedback control of the temperature of the electronic device D. Thus, highly accurate temperature control is performed. In a state other than inspection of the electronic device D, the temperature control is performed based on the temperature measurement signal of the temperature sensor 31a that is disposed at the lid member 31 of the stage 10.

Figure 7:
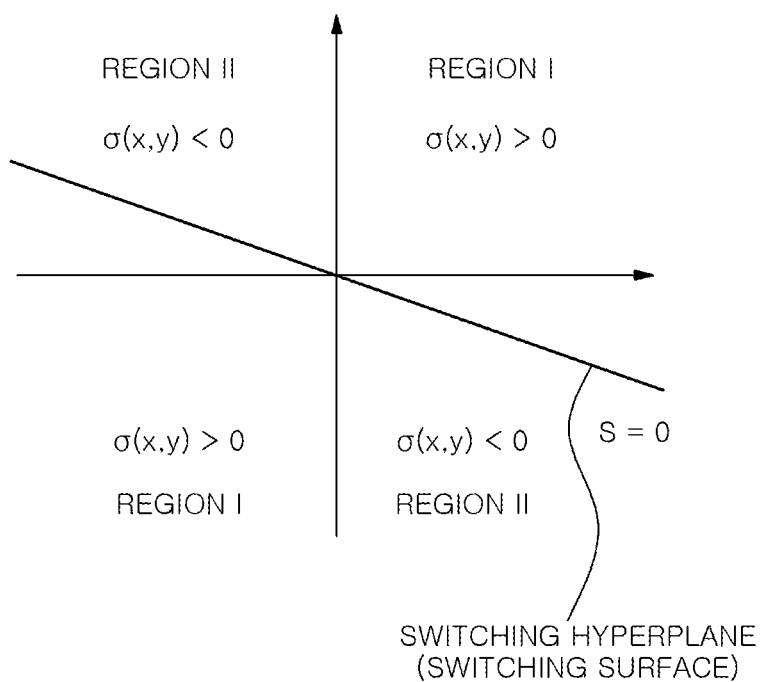
FIG. 7 explains a sliding mode control.

The sliding mode control is a control method for switching the control of the control target to above and below the switching hyperplane to converge the state of the control target onto a preset switching hyperplane (switching surface) in the state space. When the initial state of the control target is outside the switching hyperplane, the state of the control target is directed to reach and be converged onto the switching hyperplane within a finite time (reaching mode). When the state of the control target reaches the switching hyperplane, the state is converged toward a target value while sliding in the switching hyperplane (sliding mode). The control input u of the sliding mode control is the sum of a linear term (linear control operation amount) $u_1$ and a nonlinear term (nonlinear control operation amount) $u_{n1}$, and may be expressed by the following equation:

$$U = -(SB)^{-1}SAx - K(SB)^{-1} \cdot \text{sgn}(\sigma)$$

$$= -(SB)^{-1}\{SAx + K \cdot \text{sgn}(\sigma)\}$$

$$\sigma = Sx$$

where $SAx$ is a linear term, and $K \cdot \text{sgn}(\sigma)$ is a nonlinear term, A and B are matrices of a state equation, and S and K are control parameters. The function sgn represents a discontinuous function, and $\text{sgn}(\sigma)$ is a switching function of the sliding mode. The switching hyperplane may be designed with a framework of linear control, and in the sliding mode, the control proceeds on the switching hyperplane by the nonlinear term while moving back and forth between the region II and the region I, shown in FIG. 7, in a very short period of time. In other words, in the sliding mode, the linear term (linear control operation amount) allows the state of the control system on the switching hyperplane to have minimum control error, and the nonlinear term (nonlinear control operation amount) allows the state of the control system to direct toward the switching hyperplane if there is a modeling error or an uncertain disturbance. Accordingly, the temperature control can be performed with extremely high accuracy.

Hereinafter, an appropriate example of the temperature controller 30 will be described. However, the temperature controller 30 is not limited to the following example as long as it is a control system including sliding mode control.

(First Example of the Temperature Controller)

In the first example of the temperature controller 30, the temperature control is performed by a sliding mode control in which the power (current value output) supplied to the LEDs 41 that is the heating source is used as an operation amount and a cooling mode control in which the power (i.e., opening/closing signal of the high-speed valve) supplied to the high-speed valve that is the cooling source is used as an operation amount.

Accordingly, heat absorption can be increased compared to the case of merely using the sliding mode control in which the power (current value output) supplied to the LEDs 41 (the heating source) is the operation amount, making it possible to cope with severe heat emission disturbance.

Figure 8:
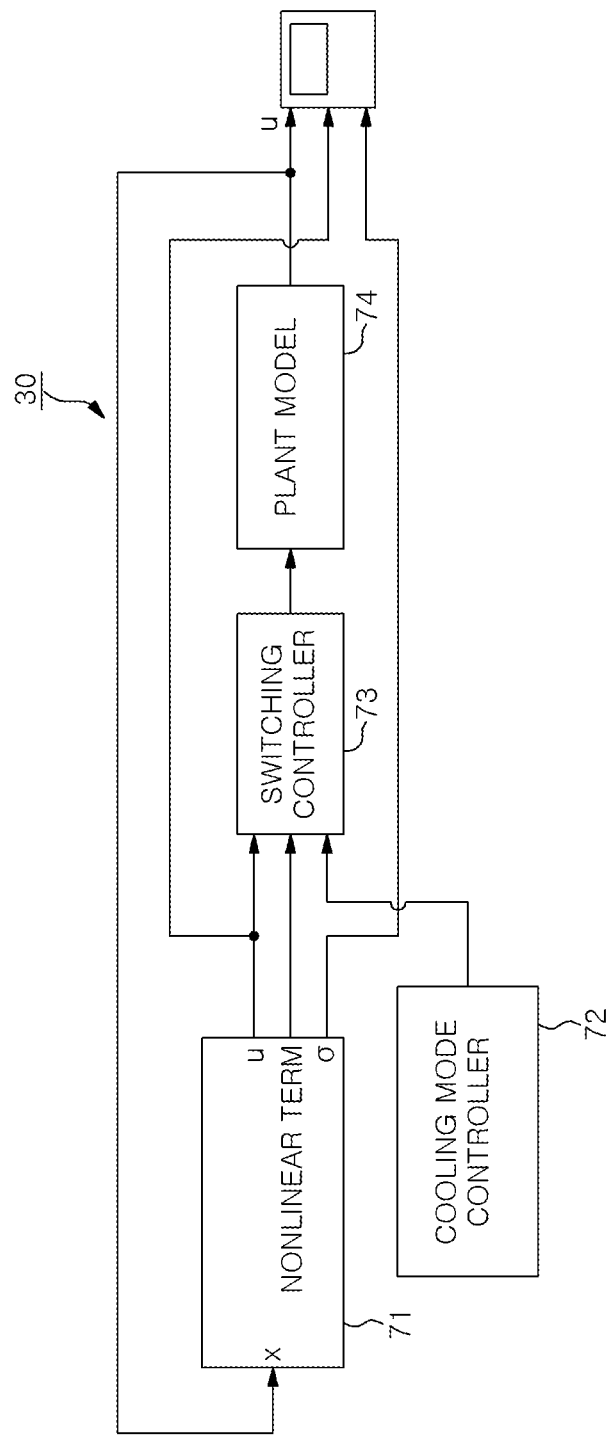
FIG. 8 is a block diagram showing a control block of a first example of a temperature controller.

FIG. 8 is a block diagram showing a control block of the temperature controller 30 according to the first example. In the first example, the temperature controller 30 includes a sliding mode controller 71, a cooling mode controller 72, a switching controller 73, and a plant model 74.

Figure 9:
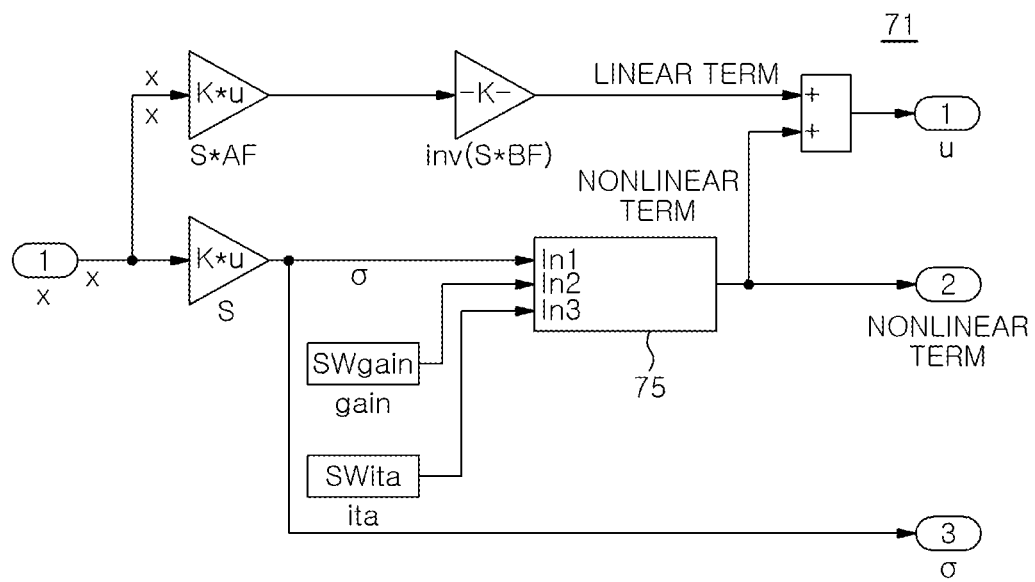
FIG. 9 is a block diagram showing an interior of a sliding mode controller in the first example of the temperature controller of FIG. 8.
Figure 10:
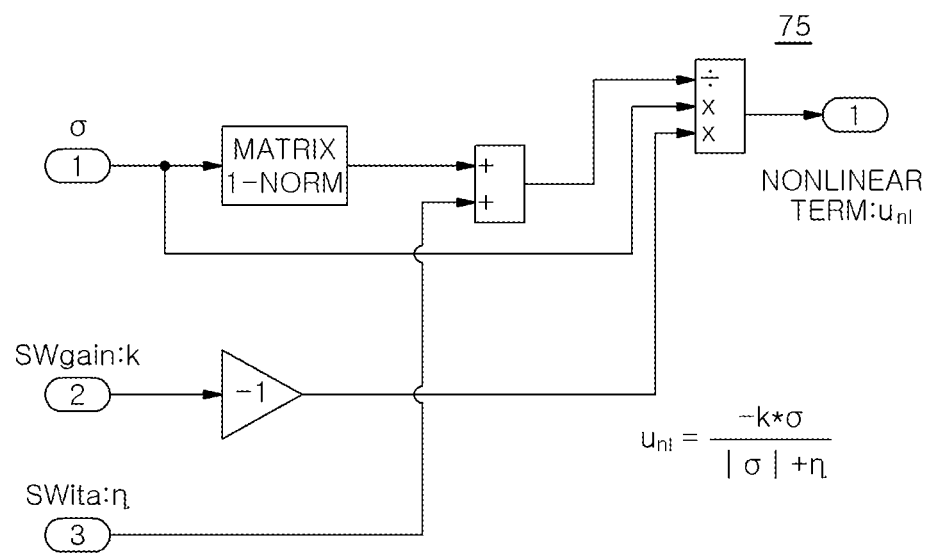
FIG. 10 is a block diagram showing a nonlinear input unit of the sliding mode controller of FIG. 9.

The sliding mode controller 71 is configured to perform the temperature control by outputting the power (current value output) supplied to the LEDs 41 of the heating mechanism 40 as an operation amount. In the sliding mode controller 71, as shown in FIG. 9, the estimated temperature x of the electronic device D is inputted, and a control input u is formed by a linear term (linear gain term) and a nonlinear term (nonlinear gain term) generated by a nonlinear input unit 75. As shown in FIG. 10, in the nonlinear input unit 75, a nonlinear input (nonlinear term) $u_{n1}$ is generated by a switching function σ, SWgain k, and SWita η. $u_{n1}$ is expressed by the following equation:

$$u_{n1} = -k \cdot \sigma/(|\sigma|+\eta).$$

where η is a chattering suppression term. Since the nonlinear input (nonlinear term) $u_{n1}$ has an infinite switching frequency, the state amount chatters (vibration at high frequency) near a switching hyperplane. Therefore, η is used to suppress chattering and planarize the input.

Figure 11:
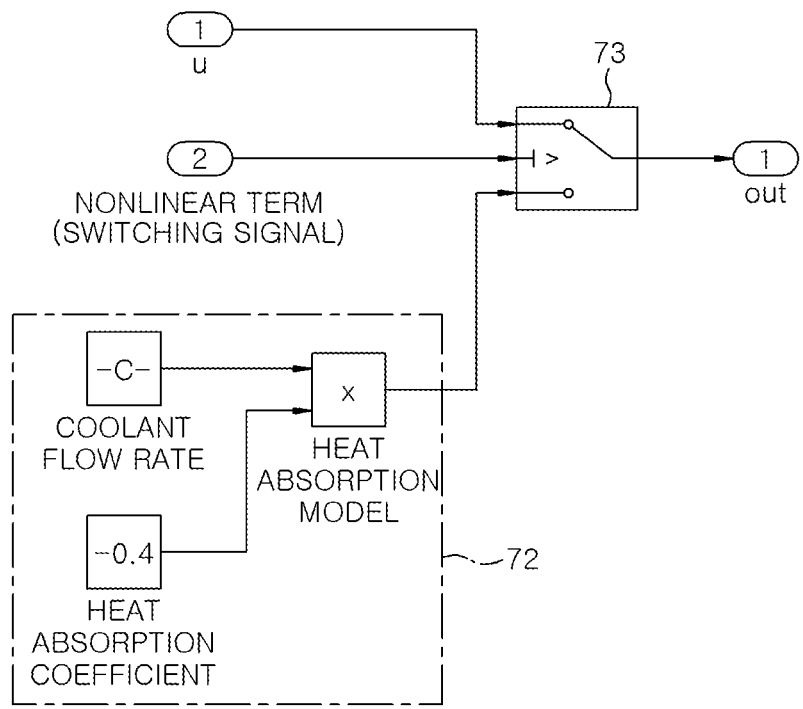
FIG. 11 is a block diagram showing a configuration of a cooling mode controller and a switching controller in the first example of the temperature controller of FIG. 8 and transmission/reception of signals therebetween.

FIG. 11 is a block diagram showing the interiors of the cooling mode controller 72 and the switching controller 73. The cooling mode controller 72 is configured to perform a cooling control while using the power (the opening/closing signal of the high-speed valve 54) supplied to the high-speed valve 54 that is a cooling source as an operation amount. Accordingly, the amount of the coolant supplied to the coolant channel 32a of the stage 10 is controlled, and the temperature of the electronic device D is controlled. The output of the cooling mode controller 72 is calculated by a heat absorption model based on the flow rate of the coolant and a heat absorption coefficient. In FIG. 11, it is illustrated that the heat absorption coefficient is −0.4. However, this is merely an example, and the value varies according to the electronic device or the like.

The switching controller 73 is configured to use the value of the nonlinear term $u_{n1}$ of the sliding mode controller as a switching signal. In other words, based on the value of the nonlinear term $u_{n1}$, the switching controller 73 determines whether to use the output (control input) of the sliding mode controller 71 alone or to use the output of the cooling mode controller 72 as a second operation amount instead of using the output of the sliding mode controller 71.

Using the output (control input) of the sliding mode controller 71 alone for the operation amount indicates that the output of the sliding mode controller 71 is outputted to the LEDs 41 that are the heating sources as a first operation amount.

Using the output of the cooling mode controller 72 for the operation amount indicates that the output of the high-speed valve that is the cooling source of the cooling mode controller 72 is used as the second operation amount.

Specifically, when the value of the nonlinear term $u_{n1}$ is positive (one side of the switching hyperplane; region I in FIG. 7), the switching controller 73 outputs the output of the sliding mode controller 71 to the LEDs 41 as the first operation amount. Further, when the value of the nonlinear term $u_{n1}$ is negative (the other side of the switching hyperplane; region II in FIG. 7), the output (opening/closing signal of the high-speed valve) of the high-speed valve that is the cooling source of the cooling mode controller 72 is used as the second operation amount. The high-speed valve 54 has a high-speed opening/closing time of 0.1 sec or less, and the high-speed valve 54 is opened and closed following the high-speed switching by the nonlinear term $u_{n1}$. Accordingly, the temperature controllability can be improved.

Figure 12:
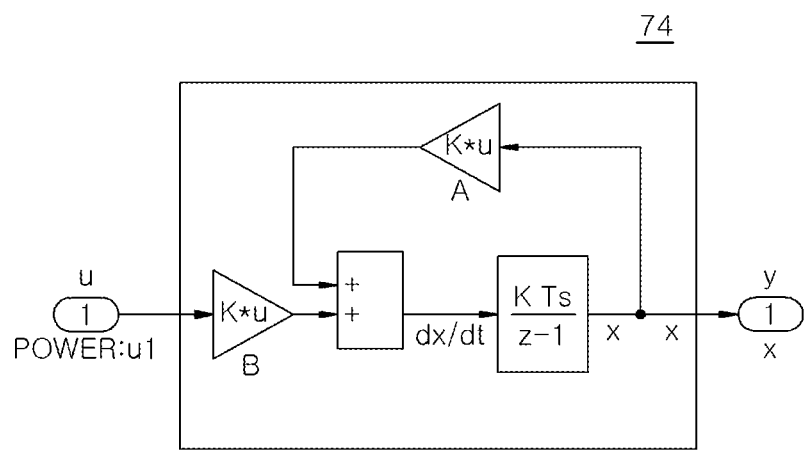
FIG. 12 is a block diagram showing an interior of a plant model.

The plant model 74 is a physical model of the electronic device D (stage 10) that is a temperature control target object and is illustrated in detail in FIG. 12. Further, the signal outputted from the switching controller 73 is inputted to the plant model 74, and a control signal is obtained via a required calculation in the plant model 74.

The temperature control of the electronic device D is performed by the temperature controller 30 while the coolant is made to flow at a constant flow rate by the variable flow rate valve 53 of the cooling mechanism 50. In other words, the temperature controller 30 performs the temperature control of the sliding mode control in which power supplied to the LEDs 41 that are the heating sources is used as an operation amount and the temperature control of the cooling mode control in which power (high-speed valve opening/closing signal) supplied to the high-speed valve 54 that is the cooling source is used as an operation amount. Then, the switching controller 73 determines whether to perform the sliding mode control using the nonlinear term $u_{n1}$ or to perform the cooling mode control using the nonlinear term $u_{n1}$ as an opening/closing signal of the high-speed valve 54, based on the value of the nonlinear term $u_{n1}$. When the value of the nonlinear term $u_{n1}$ of the sliding mode control is positive, a temperature control is performed by the sliding mode control using the power supplied to the LEDs 41 as the operation amount. When the value of the nonlinear term $u_{n1}$ of the sliding mode control is negative, the nonlinear term $u_{n1}$ is outputted as the opening/closing signal of the high-speed valve 54, and the sliding mode control of the LEDs 41 is switched to the cooling mode control. At this time, the output of the sliding mode controller 71 is not used for the temperature control. By using the cooling mode control, the electronic device D may be cooled more greatly compared to the case when the LEDs 41 are turned off. Accordingly, the temperature controllability of the electronic device D is ensured even when the voltage (power) applied from the tester 4 to the electronic device D is very high and a large amount of heat is emitted from the electronic device D.

(Second Example of the Temperature Controller)

Figure 13:
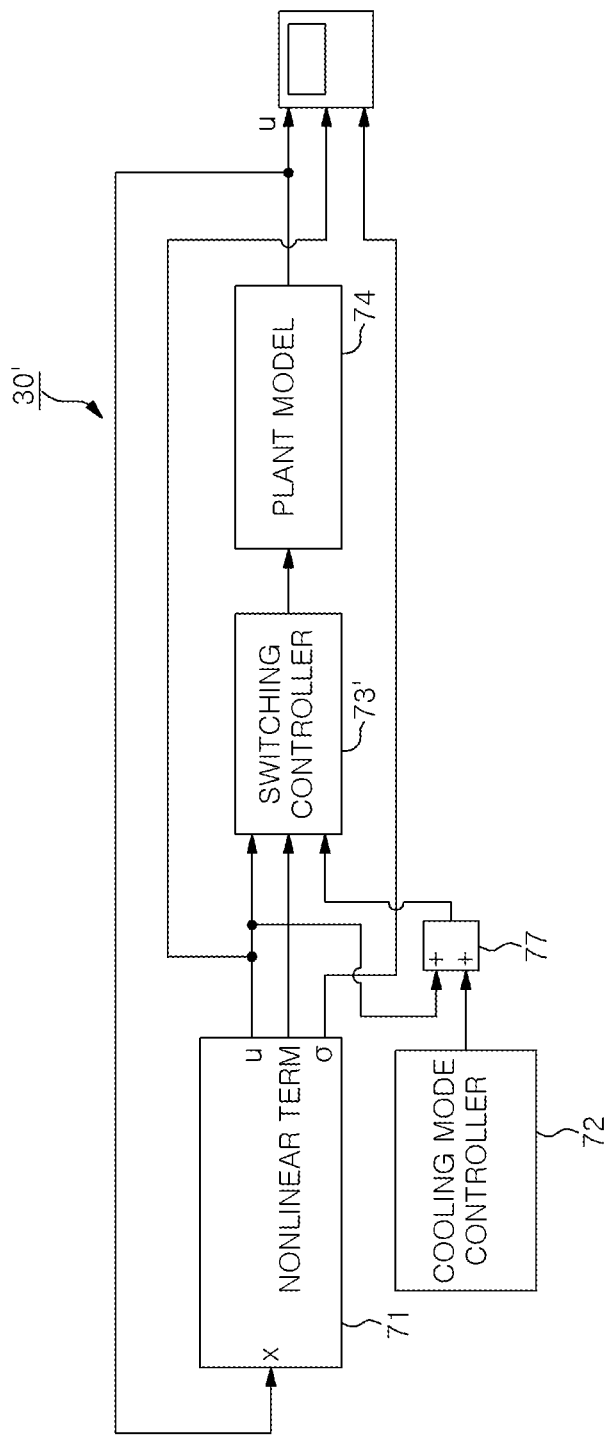
FIG. 13 is a block diagram showing a control block of a second example of the temperature controller.

The basic configuration of the temperature controller of the second example is the same as that of the temperature controller of the first example, but as shown in FIG. 13, which will be described later, the second example is different from the first example only in that the temperature controller of the second example uses a different control method.

Similar to the first example, based on the temperature estimation result of the electronic device D, the temperature controller of the second example performs the control that is based on the sliding mode control in which the power (current value output) supplied to the LEDs 41 that are the heating sources is used as an operation amount. Further, in the temperature controller of the second example, as in the temperature controller of the first example, the cooling mode control in which the power (i.e., opening/closing signal of the high-speed valve) supplied to the high-speed valve is used as an operation amount is performed in addition to the sliding mode control. However, the temperature controller of the second example is different from the temperature controller of the first example in that a control signal is also transmitted to the LEDs 41 that are the heating sources during the cooling mode.

Hereinafter, a temperature controller 30' of the second example will be described in detail.

FIG. 13 shows a control block of the temperature controller 30'. The temperature controller 30' includes a sliding mode controller 71, a cooling mode controller 72, an adder 77, a switching controller 73', and a plant model 74. The basic configurations of the sliding mode controller 71, the cooling mode controller 72, and the plant model 74 are the same as those of the temperature controller 30 of the first example.

Figure 14:
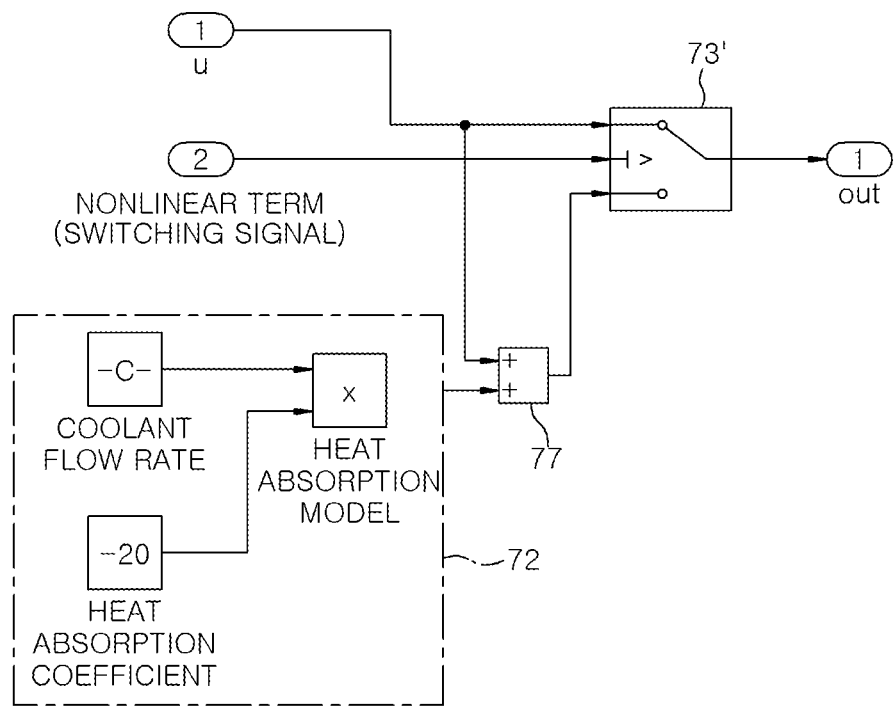
FIG. 14 is a block diagram showing an interior of a cooling mode controller and a switching controller in the second example of the temperature controller of FIG. 13 and transmission/reception of signals therebetween.

FIG. 14 is a block diagram showing the configurations of the cooling mode controller 72, the adder 77, and the switching controller 73', and transmission/reception of signals therebetween.

As described above, the cooling mode controller 72 performs a cooling control in which the power (opening/closing signal of the high-speed valve 54) supplied to the high-speed valve 54 that is the cooling source is used as an operation amount. Accordingly, the amount of the coolant supplied to the coolant channel 32a of the stage 10 is controlled, and the temperature of the electronic device D is controlled. The output of the cooling mode controller 72 is calculated by a heat absorption model based on the flow rate and the heat absorption coefficient of the coolant. In FIG. 14, it is illustrated that the heat absorption coefficient is −20. However, this is merely an example, and the value varies according to the electronic device or the like.

Similar to the switching controller 73 of the first example, the switching controller 73' uses the value of the nonlinear term $u_{n1}$ of the sliding mode controller as a switching signal. Then, based on the value of the nonlinear term $u_{n1}$, the switching controller 73' determines whether the output of the sliding mode controller 71 alone or to use the second operation amount. The switching controller 73' uses, as the second operation amount, the sum of the output of the sliding mode controller 71 and the output of the cooling mode controller 72 that are added by the adder 77. In other words, the second operation amount is the sum of the output from the sliding mode controller 71 to the LEDs 41 that are the heating sources and the output of the high-speed valve that is the cooling source of the cooling mode controller 72.

Using the output (control input) of the sliding mode controller 71 alone for the operation amount indicates that the output of the sliding mode controller 71 is outputted to the LEDs 41 that are the heating sources as a first operation amount.

Specifically, when the value of the nonlinear term $u_{n1}$ is positive (one side of the switching hyperplane; region I in FIG. 7), the switching controller 73' outputs the output of the sliding mode controller 71 to the LEDs 41 as the first operation amount. Further, when the value of the nonlinear term $u_{n1}$ is negative (the other side of the switching hyperplane; region II in FIG. 7), the sum of the output of the sliding mode controller 71 and the output (opening/closing signal of the high-speed valve) of the high-speed valve that is the cooling source of the cooling mode controller 72 is used as the second operation amount.

As described above, in the cooling mode controller 72, the high-speed valve 54 has a high-speed opening/closing time of 0.1 sec or less, and the high-speed valve 54 is opened and closed following the high-speed switching by the nonlinear term $u_{n1}$. Accordingly, the electronic device D may be further cooled compared to the case when the LEDs 41 are turned off, and the temperature controllability of the electronic device D is ensured in the case where a large amount of heat is emitted from the electronic device D. Further, since the output of the sliding mode controller 71 and the output of the high-speed valve of the cooling mode controller 72 are added together to be used as the second operation amount, the excessive response of rapid cooling can be alleviated and excellent controllability can be obtained.

<Inspection Process Performed by Inspection Apparatus>

Next, an example of an inspection process performed on the wafer W by using the inspection apparatus 1 will be described.

First, the wafer W is extracted from the FOUP of the loader 3, transferred to the stage 10, and placed on the stage 10 by a transfer device. Next, the stage 10 is moved to a predetermined position.

Then, all the LEDs 41 of the heating mechanism 40 are turned on, and the light output from the LEDs 41 is adjusted and the flow rate of the coolant flowing through the coolant channel 32a in the stage 10 is adjusted by the variable flow rate valve 53 based on the information acquired from the temperature sensors 31a of the lid member 3 such that the temperature of the lid member 31 has in-plane uniformity.

In this state, the stage 10 is moved to bring the probes 12a disposed above the stage 10 into contact with the electrodes E of the inspection target electronic device D on the wafer W. Further, the temperature sensor for transmitting the temperature data to the temperature controller 30 is switched to the infrared sensor 80.

Then, by connecting a relay to a wiring on the tester 4 side, the inspection signal is inputted to each probe 12a. In this state, the inspection of the electronic devices D is started.

During the above inspection, the temperature control device 20 controls the temperature of the electronic device D. In the temperature control device 20, for example, the temperature of the electronic device D is measured by the infrared sensor 80, and a control system including the sliding mode control of the temperature controller 30 (30') controls the heating mechanism 40 and the cooling mechanism 50 based on the measured temperature, and performs the feedback control of the temperature of the electronic device D.

In the inspection apparatus disclosed in Japanese Patent Application Publication No. H10-135315, when the inspection of the electrical characteristics of the electronic device is performed, the temperature of the substrate support is controlled via a coolant channel or a heater in the substrate support in order to emulate the implementation environment of the electronic device.

Recently, the heat emission density of the electronic device has increased due to high integration of a general-purpose CPU, influence of an increase in a clock speed, and an increase in support for GPU due to expansion of an application range of artificial intelligence. Further, executing multiple calculations with the GPU at the same time can cause the heat emission amount to steadily increase. Therefore, a heat emission disturbance occurs during the inspection of the electronic device, which may cause malfunction of the electronic device. However, Japanese Patent Application Publication No. H10-135315 does not disclose a method for eliminating such heat emission disturbance.

Hence, in the present embodiment, when the electronic device is inspected, the feedback control is performed by the control system including the highly accurate sliding mode control in consideration of the large heat emission from the electronic device. The feedback control performed by the control system including the sliding mode control requires high-speed response and, thus, it is necessary to provide the high-speed feedback of the temperature. The electronic device may have a built-in temperature measurement circuit such as a PN junction, a ring oscillator, or the like. In this case, the temperature measurement circuit can provide the high-speed feedback of the temperature of the electronic device. However, not all the electronic devices have built-in temperature measurement circuits. When the temperature measurement circuit is not included, the temperature sensor 31a such as a thermocouple disposed in the stage 10 (lid member 31) is conventionally used to measure the temperature of the electronic device and, then, the temperature control is performed based on the measured temperature.

However, the temperature sensor such as a thermocouple is generally installed in the stage 10 (lid member 31). Thus, time is wasted until the temperature reaches the temperature sensor since heat transfer takes a long time and there is also contact resistance. Accordingly, it is difficult to cope with the high-speed feedback control at the time of high-speed response.

On the other hand, in the present embodiment, the infrared sensor 80 is used as the temperature sensor during the inspection. The infrared sensor 80 is a non-contact sensor and has a high response speed of 10 msec or less. Therefore, even when the heat emission disturbance of the electronic device D is very severe, it is possible to cope with the high-speed feedback control required by the control system including the sliding mode control capable of controlling the temperature of the electronic device D with high accuracy. In other words, even when the electronic device D emits heat during the inspection, the feedback control of the temperature of the electronic device D can be performed with high accuracy and at a high speed.

The temperature controller 30 of the first example performs the temperature control by the sliding mode control in which the power supplied to the LEDs 41 that are the heating sources is used as the operation amount and the cooling mode control in which the power (opening/closing signal of the high-speed valve) supplied to the high-speed valve 54 that is the cooling source is used as the operation amount.

At this time, as described above, based on the value of the nonlinear term $u_{n1}$, the switching controller 73 determines whether to use the output (control input) of the sliding mode controller 71 alone or to use the cooling mode controller 72 by using the nonlinear term $u_{n1}$ as the opening/closing signal of the high-speed valve 54. When a large amount of heat is emitted from the electronic device D and the nonlinear term $u_{n1}$ of the sliding mode control has a negative value, the switching controller 73 switches the control mode to the cooling mode control. Thus, the stage 10 can be further cooled compared to the case when the LEDs 41 are turned off. Accordingly, the cooling performance is enhanced and the electronic device D can be sufficiently cooled even when the heat emission amount is large, making it possible to control the temperature of the electronic device D with excellent controllability. Hence, it is possible to cope with a very high heat emission disturbance compared to the case of controlling the temperature of the electronic device D only with the sliding mode control using the power supplied to the LEDs 41 as the operation amount while maintaining the flow rate of the coolant at a constant level. Further, it is preferable that the position of the high-speed valve 54 at this time is as close as possible to the stage 10 to minimize the dead time as much as possible.

Further, since the cooling mode control is performed using the high-speed valve 54, the high-speed valve 54 can be opened and closed following the positive and negative fluctuations of the nonlinear term $u_{n1}$ used as the switching signal, and the cooling control can be performed with high accuracy.

In the temperature controller 30' of the second example, based on the value of the nonlinear term $u_{n1}$, the switching controller 73' determines whether to use the output of the sliding mode controller 71 alone or to use the second operation amount that is the sum of the output of the sliding mode controller 71 and the output of the cooling mode controller 72. More specifically, when the nonlinear term $u_{n1}$ has a negative value, the output of the sliding mode controller 71 is added to the output of the high-speed valve of the cooling mode controller 72 and the sum of the output of the sliding mode controller 71 and the output of the high-speed valve of the cooling mode controller 72 are used as the second operation amount. Thus, in addition to the effect of the temperature controller 30 of the first example, the amplitude of the current value can be small and the opening frequency of the high-speed valve 54 can be low. Accordingly, it is possible to perform smoother temperature control with a smaller amplitude.

In the temperature controller 30 of the first example, although the controllability is excellent, there may be an excessive response of rapid cooling since only the high-speed valve 54 operates when the value of the nonlinear term $u_{n1}$ is negative. In other words, in order to compensate for the temperature decrease of the electronic device D at the time of opening the high-speed valve 54 by the switching controller 73, it is necessary to increase the output of the LEDs 41, and the timing (timing for opening the high-speed valve) for performing the next cooling becomes earlier. Therefore, during a control performed by the switching controller 73, the opening frequency of the high-speed valve 54 tends to be higher while the amplitude of the current value becomes large. In contrast, in the temperature controller 30' of the second example, the control signal is transmitted to the LEDs 41 during the operation of the high-speed valve 54 so that the excessive response of rapid cooling can be alleviated. Hence, the amplitude of the current value can be small, and the opening frequency of the high-speed valve 54 can be low. Accordingly, it is possible to perform smoother temperature control with a smaller amplitude.

Further, a plurality of electronic devices may be inspected at once, and all the electronic devices may be collectively inspected as in collective contact probing adopted in DRAM or the like. In any case, the temperatures of the electronic devices that are inspection targets can be controlled with high controllability by performing both the sliding mode control using the power of the LEDs 41 as the operation amount and the cooling mode control using the opening/closing of the high-speed valve.

<Other Applications>

The presently disclosed embodiments are considered in all respects to be illustrative and not restrictive. The above-described embodiments can be embodied in various forms. Further, the above-described embodiments may be omitted, replaced, or changed in various forms without departing from the scope of the appended claims and the gist thereof.

For example, in the above embodiments, the case where the LEDs are used as the heating sources has been described. However, the heating sources are not limited to the LEDs and may be other heating sources such as a resistance heater(s) and the like. Further, in the above embodiments, the electronic devices (chips) on the wafer are described as an example of the temperature control targets. However, the temperature control target is not limited thereto. In addition, although the case where the temperature control device is applied to the inspection apparatus has been described, the present disclosure is not limited thereto.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

What is claimed is:

1. A temperature control device for controlling a temperature of a temperature control object, the temperature control device comprising:
    a heater having a heating source configured to heat the temperature control object;
    a cooler having a cooling source configured to cool the temperature control object;
    an infrared sensor configured to measure the temperature of the temperature control object; and
    a temperature controller configured to allow a control system including a sliding mode control to control the heater and the cooler based on a measurement signal from the infrared sensor and perform a feedback control of the temperature of the temperature control object,
    wherein the temperature controller includes:
        a sliding mode controller configured to use a power supplied to the heating source as an operation amount;
        a cooling mode controller configured to use a power supplied to the cooling source as an operation amount; and
        a switching controller configured to determine whether to output an output of the sliding mode controller alone as a first operation amount to the heating source or to use an output of the cooling mode controller as a second operation amount without using the output of the sliding mode controller, based on a value of a nonlinear term between a linear term and the nonlinear term that are the output of the sliding mode controller.

2. The temperature control device of claim 1, wherein the infrared sensor includes a thermal diode.

3. The temperature control device of claim 1, wherein the cooler cools the temperature control object using a coolant, the cooling source is a high-speed valve configured to open and close a coolant channel, and the output of the cooling mode controller is an opening and/or closing signal for the high-speed valve.

4. The temperature control device of claim 1, wherein the heating source is an LED, and the first operation amount is a current value inputted to the LED.

5. The temperature control device of claim 1, wherein the temperature control object is an electronic device formed on a substrate.

6. A temperature control device for controlling a temperature of a temperature control object, the temperature control device comprising:
    a heater having a heating source configured to heat the temperature control object;
    a cooler having a cooling source configured to cool the temperature control object;
    an infrared sensor configured to measure the temperature of the temperature control object; and
    a temperature controller configured to allow a control system including a sliding mode control to control the heater and the cooler based on a measurement signal from the infrared sensor and perform a feedback control of the temperature of the temperature control object
    wherein the temperature controller includes:
        a sliding mode controller configured to use a power supplied to the heating source as an operation amount;
        a cooling mode controller configured to use a power supplied to the cooling source as an operation amount; and
        a switching controller configured to determine whether to output an output of the sliding mode controller alone as a first operation amount to the heating source or to use a sum of the output of the sliding mode controller and an output of the cooling mode controller as a second operation amount, based on a value of a nonlinear term between a linear term and the nonlinear term that are the output of the sliding mode controller.

7. A temperature control method for controlling a temperature of a temperature control object, the temperature control method comprising:
    measuring the temperature of the temperature control object using an infrared sensor;
    allowing a control system including a sliding mode control to control a heater configured to heat the temperature control object and a cooler configured to cool the temperature control object based on a measurement signal from the infrared sensor and performing a feedback control of the temperature of the temperature control object;
    performing a sliding mode control using a power supplied to a heating source as an operation amount;
    performing a cooling mode control using a power supplied to the cooling source configured to cool the temperature control object as an operation amount; and
    determining whether to output an output of the sliding mode control alone as a first operation amount to the heating source or to use an output of the cooling mode control as a second operation amount without using the output of the sliding mode control, based on a value of a nonlinear term between a linear term and the nonlinear term that are the output of the sliding mode control.

8. The temperature control method of claim 7, wherein the temperature control object is an electronic device formed on a substrate.

9. A temperature control method for controlling a temperature of a temperature control object, the temperature control method comprising:
  measuring the temperature of the temperature control object using an infrared sensor;
  allowing a control system including a sliding mode control to control a heater configured to heat the temperature control object and a cooler configured to cool the temperature control object based on a measurement signal from the infrared sensor and performing a feedback control of the temperature of the temperature control object;
  performing a sliding mode control using a power supplied to a heating source configured to heat the temperature control object as an operation amount;
  performing both the sliding mode control and a cooling mode control using a power supplied to the cooling source configured to cool the temperature control object as an operation amount; and
  determining whether to output an output of the sliding mode control alone as a first operation amount to the heating source or to use a sum of the output of the sliding mode control and an output of the cooling mode control as a second operation amount, based on a value of a nonlinear term between a linear term and the nonlinear term that are the output of the sliding mode control.

10. An inspection apparatus comprising:
  a stage on which a substrate having a plurality of electronic devices is placed;
  an inspection mechanism configured to inspect the electronic devices by bringing probes into contact with the electronic devices formed on the substrate on the stage; and
  a temperature control device configured to control temperatures of the electronic devices,
  wherein the temperature control device includes:
    a heater having a heating source configured to heat the electronic devices;
    a cooler having a cooling source configured to cool the electronic devices;
    an infrared sensor configured to measure the temperatures of the electronic devices; and
    a temperature controller configured to allow a control system including a sliding mode control to control the heater and the cooler based on a measurement signal from the infrared sensor and perform a feedback control of the temperatures of the electronic devices,
  wherein the temperature controller includes:
  a sliding mode controller configured to use a power supplied to the heating source as an operation amount;
  a cooling mode controller configured to use a power supplied to the cooling source as an operation amount; and
  a switching controller configured to determine whether to output an output of the sliding mode controller alone as a first operation amount to the heating source or to use an output of the cooling mode controller as a second operation amount without using the output of the sliding mode controller, based on a value of a nonlinear term between a linear term and the nonlinear term that are the output of the sliding mode controller.

11. The inspection apparatus of claim 10, wherein the cooler cools the electronic devices using a coolant,
  the cooling source is a high-speed valve configured to open and close a coolant channel, and
  the output of the cooling mode controller is an opening/closing signal for the high-speed valve.

12. The inspection apparatus of claim 10, wherein the heating source is an LED, and the first operation amount is a current value inputted to the LED.

13. The inspection apparatus of claim 10, wherein the infrared sensor is disposed in the inspection mechanism.

14. The inspection apparatus of claim 13, wherein the inspection mechanism includes a probe card having the probes, and the infrared sensor is disposed at an outer peripheral portion of the probe card or above the probes of the probe card.

15. The inspection apparatus of claim 10, wherein the stage has a temperature sensor configured to measure a temperature of the substrate, and a measurement signal of the temperature sensor is used as temperature information of the temperature controller in a state when the electronic devices are not inspected by the inspection mechanism.

16. An inspection apparatus comprising:
  a stage on which a substrate having a plurality of electronic devices is placed;
  an inspection mechanism configured to inspect the electronic devices by bringing probes into contact with the electronic devices formed on the substrate on the stage; and
  a temperature control device configured to control temperatures of the electronic devices,
  wherein the temperature control device includes:
    a heater having a heating source configured to heat the electronic devices;
    a cooler having a cooling source configured to cool the electronic devices;
    an infrared sensor configured to measure the temperatures of the electronic devices; and
    a temperature controller configured to allow a control system including a sliding mode control to control the heater and the cooler based on a measurement signal from the infrared sensor and perform a feedback control of the temperatures of the electronic devices,
  wherein the temperature controller includes:
  a sliding mode controller configured to use a power supplied to the heating source as an operation amount;
  a cooling mode controller configured to use a power supplied to the cooling source as an operation amount; and
  a switching controller configured to determine whether to output an output of the sliding mode controller alone as a first operation amount to the heating source or to use a sum of the output of the sliding mode controller and an output of the cooling mode controller as a second operation amount, based on a value of a nonlinear term between a linear term and the nonlinear term that are the output of the sliding mode controller.

* * * * *